United States Patent

Bewlay et al.

[11] Patent Number: 5,822,852
[45] Date of Patent: Oct. 20, 1998

[54] METHOD FOR REPLACING BLADE TIPS OF DIRECTIONALLY SOLIDIFIED AND SINGLE CRYSTAL TURBINE BLADES

[75] Inventors: Bernard Patrick Bewlay, Schenectady; Melvin Robert Jackson, Niskayuna, both of N.Y.

[73] Assignee: General Electric Company, Schenectady, N.Y.

[21] Appl. No.: 892,034

[22] Filed: Jul. 14, 1997

[51] Int. Cl.⁶ .................. B23P 15/00; B22D 19/10
[52] U.S. Cl. .................. 29/889.1; 29/889.72; 29/402.13; 29/402.16; 164/98
[58] Field of Search .................. 29/889.1, 889.72, 29/402.03, 402.13, 402.16, 402.18; 164/98; 278/119; 416/241 R

[56] References Cited

U.S. PATENT DOCUMENTS

| | | |
|---|---|---|
| 3,967,355 | 7/1976 | Giamei et al. . |
| 4,010,531 | 3/1977 | Andersen et al. . |
| 4,033,792 | 7/1977 | Giamei et al. . |
| 4,375,233 | 3/1983 | Rossman et al. ............. 29/889.1 |
| 4,381,944 | 5/1983 | Smith, Jr. et al. . |
| 4,422,229 | 12/1983 | Sadler ............................ 29/889.1 |
| 4,869,645 | 9/1989 | Verpoort ...................... 416/241 R |
| 5,181,550 | 1/1993 | Blazek et al. ................... 164/98 |
| 5,304,039 | 4/1994 | Corderman et al. . |
| 5,479,704 | 1/1996 | Richter et al. ................ 29/889.1 |
| 5,673,744 | 10/1997 | Bewlay et al. ................ 29/889.1 |
| 5,673,745 | 10/1997 | Jackson et al. ................. 164/98 |
| 5,676,191 | 10/1997 | Bewlay et al. ................. 164/80 |
| 5,732,468 | 3/1998 | Galley et al. ................ 29/889.1 |
| 5,743,322 | 4/1998 | Jackson et al. ................. 164/98 |

*Primary Examiner*—Irene Cuda
*Attorney, Agent, or Firm*—Noreen C. Johnson; Douglas E. Stoner

[57] ABSTRACT

A method for repairing a blade tip of a turbine blade of a gas turbine engine. The method is particularly directed to replacing the squealer tip (14) of a directionally solidified (DS) or single crystal (SX) turbine blade (10), and can be carried out using a brazing or welding technique. The method generally entails the step of machining the tip (14) to remove any damaged, worn, oxidized or eroded portions thereof sustained by the blade (10) during engine operation. A DS or SX superalloy replacement tip (18) is then placed on the surface generated by the machining operation. If a brazing operation is used, a brazing alloy composition (16) is first applied to the blade tip or replacement tip (18) prior to placement of the replacement tip (18). The brazing alloy composition (16) is composed of at least two alloys, one of which having a melting point lower than the recrystallization temperature and solvus temperature of the superalloy of the turbine blade (10), such that heating causes the brazing alloy composition (16) to flow and thereby join the replacement tip (18) to the blade tip of the turbine blade (10). Alternatively, if a welding operation is employed, the joining operation entails transmitting current through the turbine blade (10) and replacement tip (18) to resistance weld the replacement tip (18) to the blade tip of the blade (10).

20 Claims, 1 Drawing Sheet

METHOD FOR REPLACING BLADE TIPS OF DIRECTIONALLY SOLIDIFIED AND SINGLE CRYSTAL TURBINE BLADES

FIELD OF THE INVENTION

The present invention relates to turbine blades and buckets used in the turbine sections of gas turbine engines. More particularly, this invention relates to method for repairing turbine blades and buckets by joining a preformed tip to the blade tip using a brazing or welding technique.

BACKGROUND OF THE INVENTION

The operation of axial flow gas turbine engines involves the delivery of compressed air to the combustion section of the engine where fuel is added to the air and ignited, and thereafter delivered to the turbine section of the engine where a portion of the energy generated by the combustion process is extracted by a turbine to drive the compressor and fan. Accordingly, the efficiency of gas turbine engines is dependent in part on the ability to minimize leakage of compressed air between the turbine blades and the shroud of the engine's turbine section. To minimize the gap between the turbine blade tips and the shroud, turbine blades often undergo a final rotor grind such that the turbine rotor assembly closely matches its shroud diameter. As a result, some degree of rubbing with the shroud typically occurs during operation due to manufacturing tolerances, differing rates of thermal expansion and dynamic effects.

Turbine blade alloys are primarily designed to meet mechanical property requirements such as creep rupture and fatigue strength. For this purpose, turbine blades for more demanding applications are typically formed of nickel, cobalt or iron base superalloys characterized by desirable mechanical properties at turbine operating temperatures. While turbine blades having polycrystalline and equiaxed microstructures are common, the trend is blades having single crystal (SX) or directionally solidified (DS) microstructures, characterized by a crystal orientation or growth direction in a selected direction. For example, turbine blades formed of nickel base superalloys generally are manufactured to have their crystal orientation or growth direction oriented substantially parallel to the <001> crystallographic direction, thereby greatly enhancing the mechanical properties of the blade.

Though advancements in turbine blade alloys have achieved significant improvements in mechanical properties, the higher temperatures at which such alloys allow a turbine engine to operate impose more severe environmental demands, such as hot corrosion and oxidation resistance. Therefore, to enhance their environmental resistance, an aluminide or overlay coating is often applied to the blades in order to provide a protective and adherent layer of alumina scales. However, the above noted machining and rubbing to which the blades are subjected, as well as erosion from airborne particles during the operation of the turbine, often result in the removal of the aluminide or overlay coating at the blade tips. As a result, the underlying blade material is exposed, leading to hot corrosion and oxidation that cause tip recession or failure that potentially causes performance losses due to higher leakage between the blades and the shroud.

From the above, it can be appreciated that turbine blades must eventually be either replaced or repaired. Because of the considerable cost to manufacture a turbine blade, much effort has been directed toward developing methods for repairing turbine blade tips. For the repair of surface cracks and damage, powder alloy mixtures have been developed such as that taught by U.S. Pat. No. 4,381,944 to Smith, Jr. et al., assigned to the assignee of the present invention. According to this type of repair method, at least one powder alloy constituent of the powder alloy mixture has a composition similar to the alloy being repaired, i.e., a nickel or cobalt-base superalloy, while at least a second powder alloy constituent contains at least one melting point depressant, such as silicon and/or boron, allowing the lower melting second powder to melt and flow by capillarity to fill cracks while carrying some of the higher melting, solid powder along with the flowing melt. During the repair cycle, there is at least a partial dissolution of the higher melting powder and the substrate into the lower melting alloy, until the composition of the melt is altered enough that its melting point is increased and freezing occurs. While repairs using powder alloy mixtures of this type have been successful for repairing surface cracks and damage, the reduced melting point of the repair is detrimental to large repairs, and the boron and silicon content of the repair can lead to large fractions of the repaired region being converted to brittle intermetallics and intermediate phases of various potential suicides and borides. Accordingly, other repair methods have been sought when a relatively large repair area is involved, such as where an entire blade tip must be restored.

To be acceptable for larger repairs, a repair method must yield a blade tip that is capable of withstanding the high temperatures and oxidizing environment of the turbine, as well as the high centrifugal forces sustained during turbine operation. For the repair of polycrystalline and equiaxed blades, weld repairs have been performed as disclosed in U.S. Pat. No. 5,160,822 to Aleshin, assigned to the assignee of this invention. The method taught by Aleshin utilizes laser fusing techniques, powder alloys and computerized numerical control of a target blade. For a solid blade, the blade tip can be built up using a weld stitch pattern characterized by a weld path which traverses the chord of the turbine blade while cyclically traversing the width of the turbine blade. Consequently, the repair is in the form of a weld deposit that is gradually built up on the surface of the blade tip. The method can be modified for the repair of air-cooled blades having internal air passages for cooling, necessitating a raised rim portion, known as a "squealer" tip, at the perimeter of the blade tip. The squealer surrounds discharge holes at the blade tip through which cooling air is discharged from the interior of the blade.

While welding techniques are suitable for polycrystalline and equi-axed blades, they are not compatible with DS and SX blades. Instead, various repair methods are known in the art by which, after machining, an extension is formed in situ on the machined blade tip of a DS or SX blade to form a new blade tip, preferably with a DS or SX microstructure. An example of such a method is disclosed in U.S. Pat. No. 5,304,039 to Corderman et al., assigned to the assignee of the present invention, by which the end of a blade is used as a growth seed for a melt from which the blade tip is directionally solidified to form an integral extension of the blade. The process taught by Corderman et al. is applicable to both solid blades and blades having squealer tips. While producing a blade tip that is securely attached to a blade, such methods necessitate the use of molds, mandrels and/or crucibles during the repair operation. Furthermore, additional operations are necessary to prepare the blade for repair and to finish the blade tip to attain the dimensions required for the blade.

In view of the above, it would be advantageous if a method were available for repairing a turbine blade tip, by which a blade tip could be repaired or replaced with minimal requirements for equipment and a reduced number of pre- and post-repair operations.

SUMMARY OF THE INVENTION

According to the present invention, there is provided a method for repairing a blade tip of a turbine blade or bucket of a gas turbine engine. The method is particularly directed to replacing the squealer tips of directionally solidified (DS) or single crystal (SX) turbine blades and buckets, and is carried out using a brazing or welding technique. While applicable to the repair of blades and buckets for a variety of turbomachinery, the following discussion will refer to blades as a matter of convenience, with the understanding that the term "blades" is meant to also encompass turbine buckets.

The method of this invention generally entails the step of machining the squealer tip to remove any damaged, worn, oxidized or eroded portions thereof sustained by the blade during engine operation. A DS or SX superalloy replacement tip is then placed on the surface generated by the machining operation. If a brazing operation is used, a brazing alloy composition is first applied to the surface of the blade tip prior to placement of the new tip. The brazing alloy composition is formed of at least two alloys, one of which will flow at a temperature lower than the recrystallization temperature and gamma-prime ($\gamma'$) solvus temperature of the blade superalloy, such that heating causes the brazing alloy composition to flow and thereby join the replacement tip to the blade tip of the turbine blade. Alternatively, if a welding operation is employed, the joining operation entails transmitting current through the turbine blade and replacement tip to resistance weld the replacement tip to the turbine blade tip. Afterwards, the replacement tip can be machined as may be required to bring the tip and/or bond joint within dimensional tolerances for the blade.

According to this invention, a SX replacement tip can be joined to a DS or SX turbine blade. If the turbine blade is a SX superalloy, the crystallographic orientation of the replacement tip is preferably matched with the crystallographic orientation of the turbine blade prior to joining, particularly if joining is by welding. Also according to this invention, joining the replacement tip to the blade by brazing can be performed in a batch process, by which a plurality of turbine blades are simultaneously heated to join the replacement tips to the corresponding blade tips of the turbine blades.

A significant advantage of this invention is that the complicated processing and equipment required by prior art techniques for repairing DS and SX turbine blades through the in situ formation of an extension is avoided. Instead, the invention employs the use of a brazing composition or resistance welding to join a DS or SX replacement tip to a turbine blade that has seen service in a gas turbine engine. While replacement tips for polycrystalline and equiaxed turbine blades have been repaired by welding techniques in which a weld deposit is gradually built up, such repair techniques do not take advantage of the unique mechanical properties of DS and SX blades, such that directly brazing or welding a replacement tip to used DS and SX blades has not been suggested in the prior art.

Other objects and advantages of this invention will be better appreciated from the following detailed description.

DETAILED DESCRIPTION OF THE INVENTION

Figure 1:
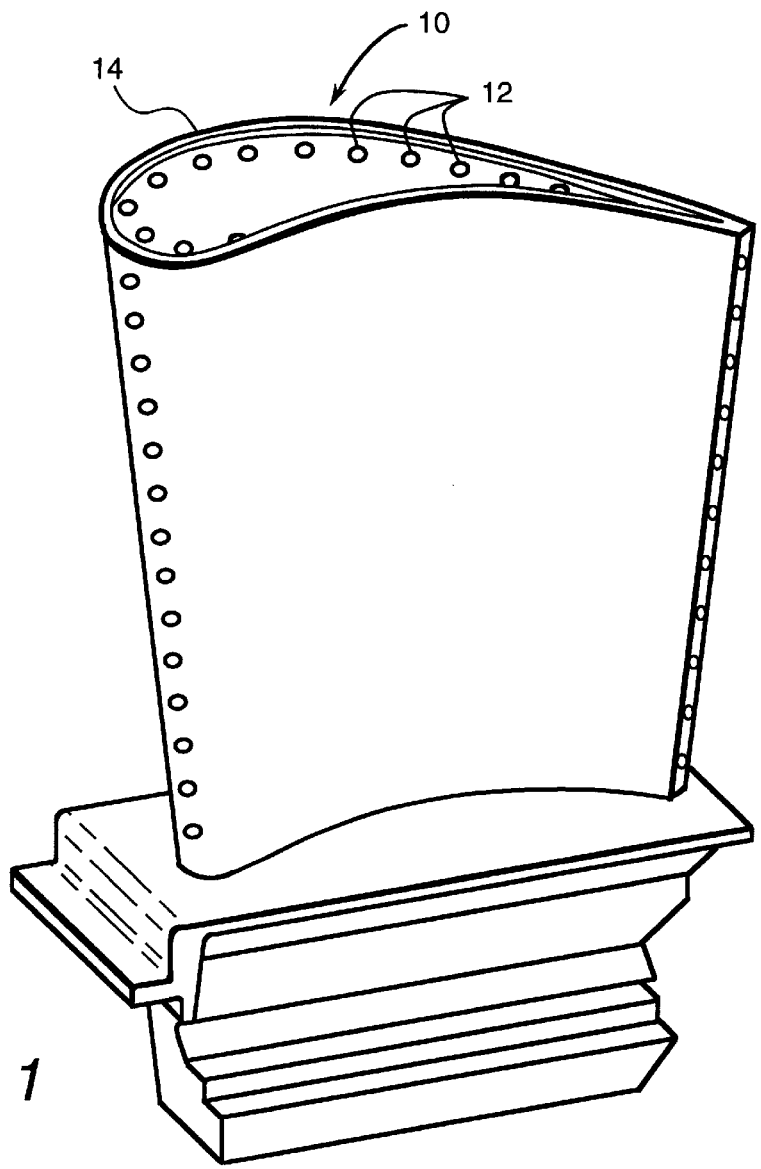
FIG. 1 is a perspective view of a high pressure turbine blade equipped with a squealer tip in accordance with this invention.

The present invention provides a method for repairing a blade tip of a turbine blade used in a gas turbine engine, and particularly to a turbine blade used in the high pressure turbine section of axial flow gas turbine engine. A representative turbine blade 10 is illustrated in FIG. 1, and is shown as having a squealer tip 14 as known in the art. The blade 10 is preferably formed from a suitable high temperature material, such as an appropriate nickel, cobalt or iron-base superalloy of a type known in the art, and may be cast as a single crystal (SX) casting, such as René N5, or as a directionally solidified (DS) casting, such as René 142, to promote the high temperature properties of the blade 10. The squealer tip 14 is generally a raised peripheral rim extending from the blade tip, and surrounds discharge holes 12 in the blade tip through which cooling air is discharged from the blade 10. The squealer tip 14 projects a sufficient distance from the surface in which the holes 12 are formed in order to avoid damage to the holes 12 even if the squealer tip 14 has been partially removed during final grind or after significant rubbing has occurred in service.

Figures 2, 3:
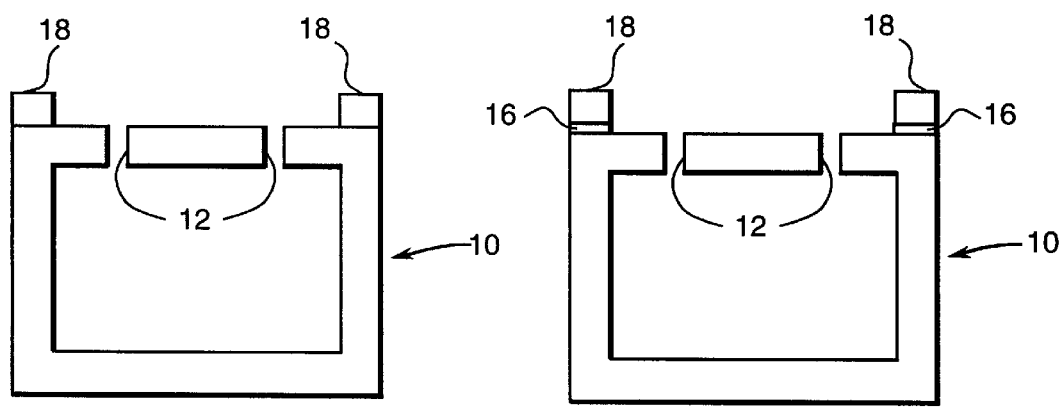
FIGS. 2 and 3 are cross-sectional views of turbine blade squealer tips repaired in accordance with this invention.

In accordance with this invention, a process is provided for repairing or completely replacing the squealer tip 14 by brazing or welding to the blade tip a replacement tip 18 formed of a DS or SX superalloy material, as generally depicted in FIGS. 2 and 3. The replacement tip 18 can be formed by a conventional investment casting technique, and can be used in the as cast condition or after heat treatment. As a DS or SX superalloy, the replacement tip 18 will generally have suitable mechanical properties for survival in the hostile environment of a gas turbine engine. The alloy for the replacement tip 18 can be the same as or different from the remainder of the turbine blade 10. If a different alloy, the composition of the replacement tip 18 can be chosen to possess certain properties particularly desirable for the blade tip region, such as hot corrosion resistance, oxidation resistance and stress rupture properties.

The repair method of the invention generally entails machining the blade 10 to remove the squealer tip 14 or portions thereof that were damaged, worn, oxidized or eroded during engine operation. The surface generated by the machining operation is preferably close to, or as shown in FIGS. 2 and 3, coincident with the surface of the blade 10 in which the discharge holes 12 are present. A DS or SX superalloy replacement tip 18 is then joined to the machined surface. According to a first embodiment of the invention, if a welding operation is employed, the replacement tip 18 is joined to the machined surface by transmitting a current through the turbine blade 10 and replacement tip 18. Preferred parameters for this process include a current of about 100 to about 10,000 amps (AC or DC) and a contact load of about 5 to about 1000 pounds (about 22 to about 4450 newtons). As a result of the contact resistance at the interface between the tip 18 and blade 10, localized heating produces a sufficient temperature increase to cause resistance welding of the tip 18 to the blade 10. Localized heating is further promoted because the tip 18, whose geometry is essentially the same as the original squealer tip 14, has a much smaller cross sectional area than does the remainder of the blade 10, thereby concentrating resistance heating at the tip to blade interface. Though the resistance heating technique provides the advantage of localized heating at the tip blade interface, those skilled in the art will appreciate that other heating methods could be used, such as induction, radiative, laser or plasma heating techniques.

The alloy for the replacement tip 18 can be the same as that for the blade 10, e.g., a nickel base superalloy, though a different alloy could be used. Welding is preferably performed in an inert atmosphere, such as argon, or in a vacuum. Afterwards, the replacement tip 18 can be machined if necessary to bring the tip 18 and the resulting weld joint within dimensional tolerances required for the blade 10.

According to this invention, the crystallographic orientation of the SX or DS replacement tip 18 is preferably matched using standard Laué X-ray techniques or another suitable process prior to joining. Alignment is generally more readily achieved between SX replacement tips and SX turbine blades, as matching the grains of a DS replacement tip with a DS blade across the weld interface is difficult. As such, SX replacement tips 18 are believed to be more suitable for the repair of DS blades because an SX replacement tip minimizes the number of boundaries formed at the bond plane.

In accordance with a second embodiment of this invention, the replacement tip 18 is brazed to the blade 10 using a brazing alloy composition 16 placed between the blade 10 and replacement tip 18, as depicted in FIG. 3. The brazing alloy composition 16 is a mixture of at least two alloys, one of which will melt at a temperature lower than the recrystallization temperature and solvus temperature of the blade superalloy, such that the composition 16 flows during heating and thereafter joins the replacement tip 18 to the blade 10 without adversely affecting its SX or DS microstructure. In a preferred embodiment, the composition 16 also flows at a temperature lower than the recrystallization temperature and solvus temperature of the alloy for the tip 18, such that brazing can be safely performed in a batch treatment by which a number of blades 10 are simultaneously processed.

A preferred brazing alloy composition 16 for this purpose is a mixture of two alloy powders, one of which contains a melting point depressant such as silicon and/or boron. For example, a suitable higher melting alloy powder is a nickel or cobalt base superalloy having the same composition as the replacement tip 18 and/or blade 10, while a suitable lower melting alloy powder may have roughly the same composition as the higher melting alloy powder but with the addition of up to about 6 atomic percent silicon and/or up to about 12 atomic percent boron. The lower melting alloy powder preferably has a melting point of about 1200° C. or less in order to melt and adequately flow at a temperature at which brazing can be performed without detrimentally altering the microstructure of the blade 10. During the heating cycle, there is at least a partial dissolution of the higher melting alloy powder and the surfaces of the blade 10 and tip 18 into the melt formed by the lower melting alloy powder, until the composition of the melt is sufficiently altered such that the melting range of the melt is increased and freezing occurs.

The composition 16 can be in the form of a thin foil, a suitable thickness being about 25 to about 250 micrometers, though it is foreseeable that lesser or greater thicknesses could be used. The foil can be formed by appropriately hot isostatic pressing (HiPping) the mixture of alloy powders. Alternatively, the composition 16 can be deposited directly on the blade 10 or tip 18 in powder form, or could be provided in the form of a slurry or tape which is directly applied to blade 10 or tip 18.

Brazing can be performed by heating the composition 16 by induction, radiative or plasma heating while applying a compressive load on the replacement tip 18 in a direction generally normal to the tip to blade interface. Alternatively, heating can be achieved by resistance welding in a manner similar to that discussed for the welding embodiment of this invention, though with reduced current to lower the temperature at the contact interface. Afterwards, the replacement tip 18 and/or the bond joint between the tip 18 and blade 10 can be machined to restore the dimensional requirements of the blade 10.

In view of the above, it can be seen that a significant advantage of this invention is that the complicated processing and equipment required by prior art techniques for repairing DS and SX turbine blades through in situ formation of an extension is avoided. Instead, the invention employs the use of a brazing composition or resistance welding to replace a worn, oxidized, eroded or otherwise damaged blade tip with a DS or SX replacement tip 18. Furthermore, as cast articles, the mechanical and environmental properties of the replacement tip 18 can be more precisely controlled than prior art welding techniques for polycrystalline and equi axed blades, by which repairs are built up by numerous weld deposits. Finally, while the invention has been described in terms of repairing an air cooled blade, the disclosed process could be used to repair solid blades.

Therefore, while the invention has been described in terms of a preferred embodiment, it is apparent that other forms could be adopted by one skilled in the art. Accordingly, the scope of the invention is to be limited only by the following claims.

What is claimed is:

1. A method for replacing a tip on a directionally solidified or single crystal turbine blade, the method comprising the steps of:

providing a directionally solidified or single crystal turbine blade of a superalloy, the turbine blade having a blade tip;

removing a portion of the blade tip to generate an attachment surface;

placing a replacement tip on the attachment surface, the replacement tip being a directionally solidified or single crystal superalloy material; and applying heat to join the replacement tip to the turbine blade.

2. The method of claim 1, wherein the replacement tip is a single crystal superalloy material and wherein the turbine blade is a directionally solidified superalloy material.

3. The method of claim 1, wherein the replacement tip is a single crystal superalloy material having a determinable crystallographic orientation, and wherein the turbine blade is a single crystal superalloy material having a determinable crystallographic orientation, the method further comprising the step of matching the crystallographic orientation of the replacement tip with the crystallographic orientation of the turbine blade.

4. The method of claim 1, further comprising the step of machining the replacement tip after the heating step.

5. The method of claim 1, further comprising the step of placing a brazing alloy composition between the attachment surface and the replacement tip prior to the heating step, the brazing alloy composition containing at least two alloys, one of the two alloys containing a melting point depressant such that the brazing alloy composition flows at a temperature lower than a recrystallization temperature and a solvus temperature of the superalloy of the turbine blade, wherein the heating step causes the brazing alloy composition to flow and join the replacement tip to the turbine blade.

6. The method of claim 5, wherein the brazing alloy composition flows at a temperature lower than a recrystallization temperature and a solvus temperature of the superalloy material of the replacement tip.

7. The method of claim 5, wherein the brazing alloy composition is formed of a mixture of two superalloy powders, one of the superalloy powders containing the melting point depressant.

8. The method of claim 1, wherein the heating step entails transmitting current through the turbine blade and replacement tip to resistance weld the replacement tip to the turbine blade.

9. The method of claim 8, wherein the superalloy material of the replacement tip is the same as the superalloy of the turbine blade.

10. The method of claim 1, wherein a plurality of turbine blades are processed according to the steps of claim 1, and wherein the heating step entails simultaneously heating the plurality of turbine blades to join the replacement tips to the plurality of turbine blades.

11. A method for replacing a squealer tip on a directionally solidified or single crystal turbine blade of a gas turbine engine, the method comprising the steps of:

providing a directionally solidified or single crystal turbine blade of a superalloy, the turbine blade having a squealer tip at a blade tip thereof;

machining the squealer tip to remove any damaged, worn, oxidized or eroded portions thereof, such that an attachment surface is generated at the blade tip;

providing a brazing alloy composition formed of a mixture of two alloy powders, one of the alloy powders containing a melting point depressant such that the brazing alloy composition flows at a temperature lower than a recrystallization temperature and a solvus temperature of the superalloy of the turbine blade;

applying a replacement tip to the attachment surface of the blade tip so that the brazing alloy composition is between the replacement tip and the attachment surface, the replacement tip being a directionally solidified or single crystal superalloy material; and heating the brazing alloy composition and the replacement tip to cause the brazing alloy composition to flow and thereby join the replacement tip to the blade tip of the turbine blade.

12. The method of claim 11, wherein the brazing alloy composition is in a form selected from the group consisting of a foil, a slurry and a tape.

13. The method of claim 11, wherein the brazing alloy composition flows at a temperature lower than a recrystallization temperature and a solvus temperature of the superalloy material of the replacement tip.

14. The method of claim 11, wherein the brazing alloy composition is formed of a mixture of two alloy powders, one of the alloy powders being a nickel or cobalt base superalloy, at least a second of the alloy powders being a nickel or cobalt base superalloy containing the melting point depressant so that the second of the alloy powders has a melting point of about 1200° C. or less.

15. The method of claim 11, wherein a plurality of turbine blades are processed according to the steps of claim 11, and wherein the heating step entails simultaneously heating the plurality of turbine blades to join the replacement tips to corresponding blade tips of the plurality of turbine blades.

16. A method for replacing a squealer tip on a directionally solidified or single crystal turbine blade of a gas turbine engine, the method comprising the steps of:

providing a directionally solidified or single crystal turbine blade of a superalloy, the turbine blade having a squealer tip at a blade tip thereof;

machining the squealer tip to remove any damaged, worn, oxidized or eroded portions thereof, such that an attachment surface is generated at the blade tip;

applying a replacement tip to the attachment surface, the replacement tip being a directionally solidified or single crystal superalloy material; and transmitting current through the turbine blade and replacement tip to resistance weld the replacement tip to the blade tip of the turbine blade.

17. The method of claim 16, wherein the replacement tip is a single crystal superalloy material and wherein the turbine blade is a directionally solidified superalloy material.

18. The method of claim 16, wherein the replacement tip is a single crystal superalloy material having a determinable crystallographic orientation, and wherein the turbine blade is a single crystal superalloy material having a determinable crystallographic orientation, the method further comprising the step of matching the crystallographic orientation of the replacement tip with the crystallographic orientation of the turbine blade.

19. The method of claim 16, wherein the superalloy material of the replacement tip is the same as the superalloy of the turbine blade.

20. The method of claim 16, wherein a plurality of turbine blades are simultaneously processed according to the steps of claim 16.

* * * * *